United States Patent
Pyo

(10) Patent No.: US 6,593,236 B2
(45) Date of Patent: Jul. 15, 2003

(54) METHOD OF FORMING A METAL WIRING IN A SEMICONDUCTOR DEVICE WITH COPPER SEED

(75) Inventor: Sung Gyu Pyo, Kyungki-Do (KR)

(73) Assignee: Hynix Semiconductor Inc., Kyungki-do (KR)

( * ) Notice: Subject to any disclaimer, the term of this patent is extended or adjusted under 35 U.S.C. 154(b) by 0 days.

(21) Appl. No.: 09/874,505

(22) Filed: Jun. 5, 2001

(65) Prior Publication Data

US 2002/0009884 A1 Jan. 24, 2002

(30) Foreign Application Priority Data

Jun. 20, 2000 (KR) ........................................ 2000-33984

(51) Int. Cl.$^7$ ............................................. H01L 21/44
(52) U.S. Cl. ........................ 438/687; 438/626; 438/643
(58) Field of Search ................................ 438/687, 623, 438/626, 627, 628, 629, 631, 633, 638, 643–645, 692, 691, 690, 783, 758, 636, 637, 513

(56) References Cited

U.S. PATENT DOCUMENTS

| | | | |
|---|---|---|---|
| 6,077,571 A | * | 6/2000 | Kaloyeros et al. .......... 427/576 |
| 6,107,192 A | * | 8/2000 | Subrahmanyan et al. ... 438/655 |
| 6,197,690 B1 | * | 3/2001 | Schonauer et al. .......... 438/691 |
| 2001/0005056 A1 | * | 6/2001 | Cohen ........................ 257/751 |

FOREIGN PATENT DOCUMENTS

| | | | | |
|---|---|---|---|---|
| KR | 1998-065748 | | 10/1998 | |
| KR | 2000-0022014 | | 4/2000 | |
| KR | 200033984 | * | 6/2000 | .......... H01I/467/10 |

OTHER PUBLICATIONS

Hwang et al., "Surfactant Catalyzed Chemical Vapor Deposition Of Copper Thin Films", Chem. Master 2000, pp. 2076–2081, Dec. 1991.*

* cited by examiner

Primary Examiner—Carl Whitehead, Jr.
Assistant Examiner—Yennhu B. Huynh
(74) Attorney, Agent, or Firm—Marshall, Gerstein & Borun

(57) ABSTRACT

A method of forming a metal wiring in a semiconductor device. A copper wiring is formed by means of CECVD method by which a chemical enhancer layer is utilized for increasing the deposition speed of copper. The damascene pattern is filled by means of MOCVD method using a copper precursor in order to increase the deposition speed. The chemical enhancer layer rises to the surface of copper after deposition of copper by a CECVD method and then the relatively high resistivity chemical enhancer layer that has risen to the surface of copper by plasma process is removed. Therefore, the ultra-fine damascene pattern can be rapidly filled with copper without increasing the resistance of the copper wiring.

14 Claims, 2 Drawing Sheets

METHOD OF FORMING A METAL WIRING IN A SEMICONDUCTOR DEVICE WITH COPPER SEED

BACKGROUND

1. Technical Field of the Invention

A method of forming a metal wiring in a semiconductor device. More particularly, the present invention relates to a method of forming a metal wiring in a semiconductor device by which deposition of copper is accelerated by use of a chemical enhancer layer and the chemical enhancer layer is removed after deposition of the copper. Further, process technology is disclosed by which a damascene pattern of an ultra-fine structure is filled with copper using a copper precursor, thus maximizing an electrical characteristic of a copper wiring.

2. Description of the Prior Art

Recently, although aluminum has been used a a metal wiring material in a semiconductor device, there has been recent study of a two-step process by which a titanium thin film is deposited and aluminum is then deposited by means of physical vapor deposition (PVD) method and chemical vapor deposition (CVD) method. On the other hand, when copper is used as a metal wiring, a method is employed by which copper is deposited by means of electroplating method using Ta or TaN as a diffusion prevention film of copper, which is deposited by PVD method. In both cases, however, there are limitations in that the next-generation ultra-fine wiring structures require good step coverage and a good filling of contact due to increased aspect ratio. As one solution to this limitation, a chemically enhanced chemical vapor deposition (CECVD) method is used to fill a damascene pattern using various chemical enhancers that can accelerate deposition of copper. However, due to high electrical resistivity of various chemical enhancers accelerating deposition of copper, there is a problem that it undermines the purpose of employing a copper wiring having a low electrical resistance.

SUMMARY OF THE DISCLOSURE

A method of forming a metal wiring in a semiconductor device is disclosed by which the deposition speed of copper is accelerated using a chemical enhancer layer but the chemical enhancer layer rises to the surface of copper and is removed by means of plasma process after deposition of copper, thus preventing an increase in the electrical resistance of the copper wiring due to high resistivity of the chemical enhancer.

The method of forming a metal wiring in a semiconductor device according to the disclosure is characterized in that it comprises: providing a semiconductor substrate in which an insulating film having a damascene pattern is formed; forming a diffusion prevention film on the insulating film; forming a copper seed layer on the diffusion prevention film; forming a chemical enhancer layer on the copper seed layer; forming a copper layer by means of chemical vapor deposition method; removing the chemical enhancer layer risen to the surface of the copper layer, by plasma process; and completely filling the damascene pattern by copper electroplating method, and then forming a copper metal wiring by performing a hydrogen reduction annealing process and a chemical mechanical polishing process.

BRIEF DESCRIPTION OF THE DRAWINGS

The aforementioned aspects and other features of the disclosure will be explained in the following description, taken in conjunction with the accompanying drawings, wherein.

DETAILED DESCRIPTION OF THE PRESENTLY PREFERRED EMBODIMENTS

The disclosed method will be described in detail by way of a preferred embodiment with reference to accompanying drawings.

Referring now to FIGS. 1A through 1E, a method of forming a metal wiring in a semiconductor device will be below explained in detail.

Figure 1A:
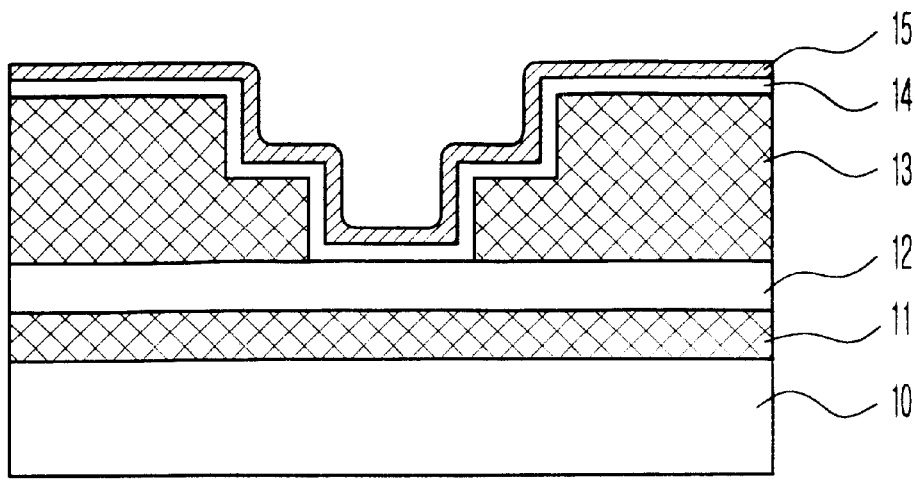
FIGS. 1A through 1E are cross-sectional views for sequentially illustrating a method of forming a metal wiring in a semiconductor device according to the disclosure.

Referring now to FIG. 1A, a first insulating film 11, a lower metal layer 12 and a second insulating film 13 are sequentially formed on a semiconductor substrate 10 in which various components for forming a semiconductor device are formed. Then, after a damascene pattern consisting of a trench and a via is formed in the second insulating film 13, a cleaning process is performed to remove an oxide layer left on the surface of the lower metal layer 12 that is exposed by the damascene pattern. Next, a diffusion prevention film 14 is formed on the second insulating film 13 which covers the damascene pattern. Thereafter, a copper seed layer 15 is formed with thickness ranging from about 50 to about 500 Å on the diffusion prevention layer 14. The copper seed layer 15 may be formed after the diffusion prevention film 14 is treated by a plasma process.

In the above process, the second insulating film 13 is formed from an insulating material having a low dielectric constant, and the trench and the via are formed in the second insulating film 13 in a dual damascene pattern. A cleaning process performed after the formation of the damascene pattern may employ a RF plasma in case that the lower metal layer 12 is made of W, Al, etc. or employ a reactive cleaning method in case that the lower metal layer 12 is made of Cu. The diffusion prevention film may be formed of at least one of ionized PVD TiN, CVD TiN, MOCVD TiN, ionized PVD Ta, ionized PVD TaN, CVD Ta, CVD TaN, CVD WN, CVD TiAlN, CVD TiSiN and CVD TaSiN.

Figure 1B:
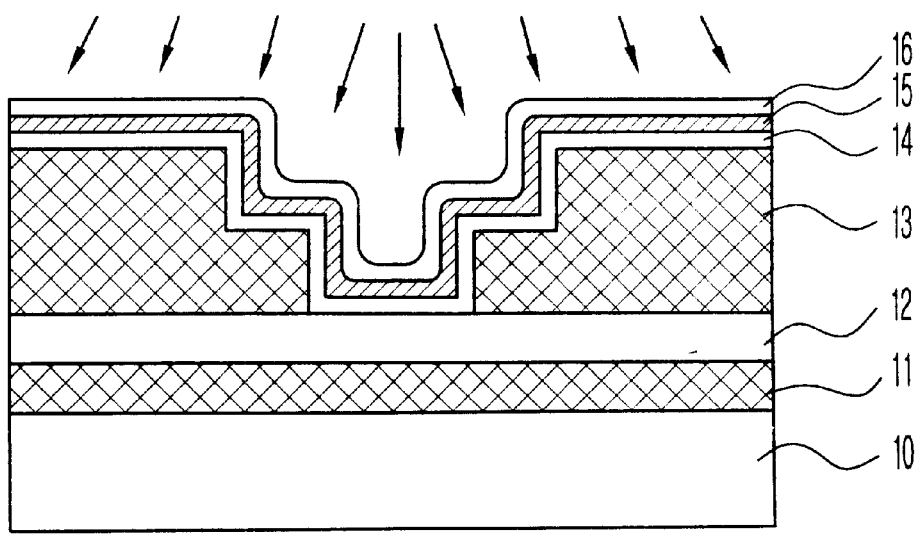

Referring now to FIG. 1B, a chemical enhancer layer 16 is formed on the copper seed layer 15. The copper seed layer 15 is formed in a thickness ranging from about 50 to about 500 Å on the diffusion prevention film 14 which accelerates the deposition of copper along with the chemical enhancer layer 16. Catalysts for forming the chemical enhancer layer 16 may include one of I (iodine)-containing liquid compounds such as $CH_3I$, $C_2H_5I$, $CD_3I$, $CH_2I_2$ etc., Hhfac1/$2H_2O$, Hhfac, TMVS, pure $I_2$, I (iodine)-containing gas and water vapor, and is performed at a temperature ranging from about −20 to about 300° C. for a time period ranging from about 1 to about 600 seconds. Also, the catalyst may include F, Cl, Br, I and At of a liquid state, which are Group VII elements in the periodic table or F, Cl, Br, I and At of a gas state.

Figure 1C:
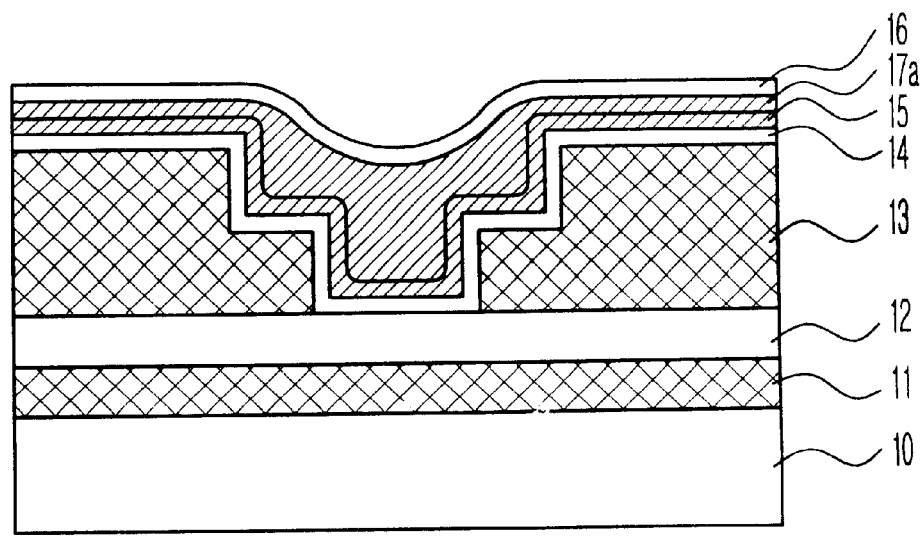

Referring now to FIG. 1C, a CECVD copper layer 17a is deposited by means of metal organic chemical vapor deposition (MOCVD) method using at least one of all the precursors of hfac series such as (hfac)CuVTMOS series, (hfac)CuDMB series, (hfac)CuTMVS series, etc., so that the damascene pattern is filled with copper. During the formation of the CECVD copper layer 17a, the chemical enhancer layer 16 rises to the surface of the CECVD copper layer 17a. The CECVD copper layer 17a may be formed by means of a selective partial fill method in order to easily fill the damascene pattern. The copper deposition process may be performed by the deposition equipment having a vaporizer of orifice scheme and spray scheme, a direct liquid injection (DLI) or control evaporation mixer (CEM).

Figure 1D:
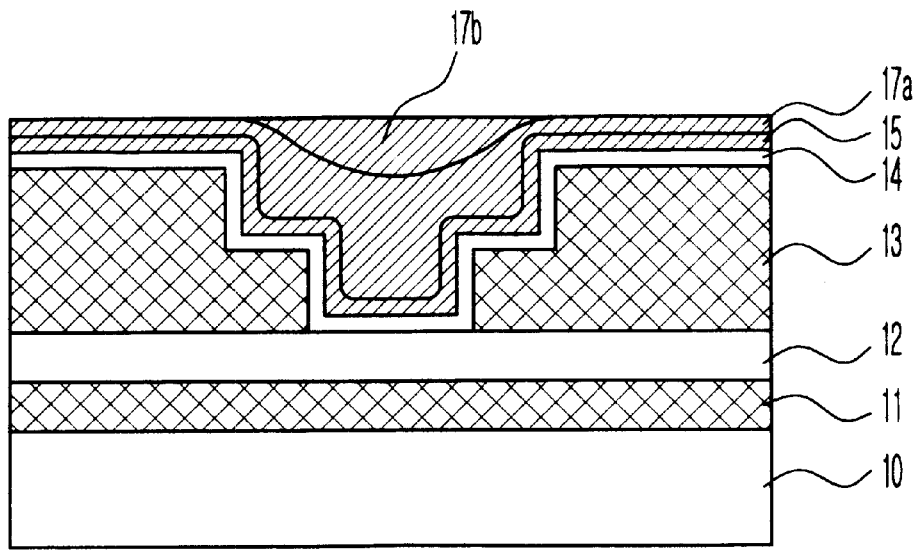

Referring now to FIG. 1D, the chemical enhancer layer 16 has risen to the surface of the CECVD copper layer 17a and is removed by means of plasma process while the CECVD copper layer 17a is deposited. The exposed CECVD copper layer 17a may have indentations due to the step coverage of the damascene pattern but the indentations can be completely filled by forming a copper plating layer 17b using copper electroplating method.

In the above, the plasma process for removing the chemical enhancer layer 16 includes processing the semiconductor substrate 10 at the temperature ranging from about 10 to about 350° C. under the chamber pressure ranging from about 0.3 to about 10 Torr, wherein the flow amount of the gas ranges from about 50 to about 500 sccm and the plasma generating power ranging from about 50 to about 7000W under a single gas atmosphere which one of $H_2$, Ar, $O_2$, $O_3$, $NH_3$, $N_2$, $H_2$+Ar and $H_2$+$NH_3$ and a mixture gas atmosphere thereof for a time period ranging from about 10 to about 600 seconds.

Also, the method of removing the chemical enhancer layer 16 may employ a multi-step by which a plasma process step and a purge step using a gas such as $H_2$, etc. are performed by at least one or more times. Upon the plasma process, the distance between the semiconductor substrate and the showerhead ranging from about 5 to about 50 mm.

Meanwhile, the chemical enhancer layer 16 uses catalyst materials as explained by reference to FIG. 1B. These materials have a very high resistivity. For example, the resistivity of iodine, which has been widely used as a catalyst material, is $5.85 \times 10^6$ $\mu\Omega$cm. Therefore, if the copper plating layer 17b is intact formed by means of electroplating method without removing the chemical enhancer layer 16 having this resistivity characteristic, it is impossible to obtain a low resistivity characteristic, being the purpose of using copper.

Figure 1E:
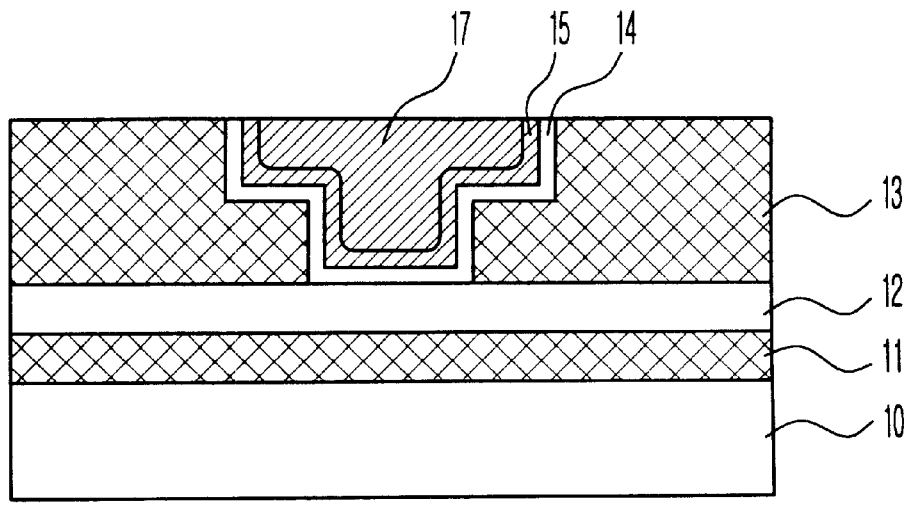

Referring now to FIG. 1E, a hydrogen reduction annealing process is performed to improve the film quality of the deposited copper layers 17a and 17b, and the copper layers 17a and 17b and the diffusion prevention film 14 on the second insulating film 13 except for the internal of the damascene pattern are removed by means of CMP process, thus forming a copper wiring 17.

In the above embodiment of the present invention, though the chemical enhancer layer 16 is formed on the copper seed layer 15, it may be formed after the diffusion prevention film 14 is formed and may be formed after the diffusion prevention film 14 is experienced by plasma process. Thereafter, if the copper seed layer 15 is formed, the chemical enhancer layer 16 rises to the surface of the copper seed layer 15, as shown in FIG. 1B.

As mentioned above, the disclosed method facilitates copper filling using a chemical enhancer layer and also forms a copper wiring after removing a chemical enhancer layer having a high resistivity by a subsequent plasma process. Thus, the disclosed method has outstanding effects that it can maximize an electrical characteristic of a copper wiring and also improve reliability of device.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed:

1. A method of forming a metal wiring in a semiconductor device comprising:
   providing a semiconductor substrate on which an insulating film having a damascene pattern is formed;
   forming a diffusion prevention film on the insulating film;
   forming a copper seed layer on the diffusion prevention film;
   forming a chemical enhancer layer on the copper seed layer;
   forming a copper layer on the chemical enhancer layer by means of chemical vapor deposition method;
   allowing the chemical enhancer layer to rise up to an upper surface of the copper layer;
   removing the chemical enhancer layer that has risen to the upper surface of the copper layer by a plasma process; and
   completely filling the damascene pattern by a copper electroplating method and forming a copper metal wiring by performing a hydrogen reduction annealing process and a chemical mechanical polishing process.

2. The method of claim 1, wherein a lower metal layer comprising W and Al is disposed beneath the insulating film and wherein a cleaning process is performed on the damascene pattern before the forming of the diffusion prevention film, the cleaning process comprising a RF plasma process.

3. The method of claim 1, wherein a cleaning process is performed on the damascene pattern before the forming of the diffusion prevention film, the cleaning process comprising a reactive cleaning method wherein the lower metal layer comprises Cu.

4. The method of claim 1, wherein the diffusion prevention film is formed by using at least one material selected from the group consisting of ionized PVD TiN, CVD TiN, MOCVD TiN, ionized PVD Ta, ionized PVD TaN, CVD Ta, CVD TaN, CVD WN, CVD TiAlN, CVD TiSiN and CVD TaSiN.

5. The method of claim 1, further including performing a plasma process on the diffusion prevention film before the copper seed layer is formed.

6. The method of claim 1, wherein the copper seed layer has a thickness ranging from about 50 to about 500 Å.

7. The method of claim 1, wherein the chemical enhancer layer has a thickness ranging from about 50 to about 500 Å and is formed with a catalyst selected from the group consisting of I (iodine)-containing liquid compound, Hhfac1/$2H_2O$, Hhfac, TMVS, pure $I_2$, and I (iodine)-containing gas with water vapor at a temperature ranging from about −20 to about 300° C. for a time period ranging from about 1 to about 600 seconds.

8. The method of claim 7, wherein the I (iodine)-containing liquid compound is selected from the group consisting of $CH_3I$, $C_2H_5I$, $CD_3I$ and $CH_2I_2$.

9. The method of claim 1, wherein the chemical enhancer layer is formed with a thickness ranging from about 50 to about 500 Å, with a catalyst selected from the group consisting of F, Cl, Br, I and At in a liquid state and at a temperature ranging from about −20 to about 300° C. for a time period ranging from about 1 to about 600 seconds.

10. The method of claim 1, wherein the chemical enhancer layer is formed with a thickness ranging from about 50 to about 500 Å, with a catalyst selected from the group consisting of F, Cl, Br, I and At in a gas state and at a temperature ranging from about −20 to about 300° C. for a time period ranging from about 1 to about 600 seconds.

11. The method of claim 1, wherein the copper layer is formed in a deposition apparatus by means of a metal organic chemical vapor deposition (MOCVD) method by use of a precursor comprising hfac.

12. The method of claim 1, wherein the plasma process is performed under a gas flow ranging from about 50 to about 500 sccm and a plasma generating power ranging from about 50 to about 7000 W for a time period ranging from about 10 to about 600 seconds, under a gas atmosphere comprising a gas selected from the group consisting of $H_2$, Ar, $O_2$, $O_3$, $NH_3$, $N_2$, a mixture of $H_2$ and Ar, and a mixture of $H_2$ and $NH_3$, and mixtures thereof.

13. The method of claim 1, wherein the plasma process is performed at a temperature ranging from about 10 to about 350° C. under a chamber pressure ranging from about 0.3 to about 10 Torr.

14. The method of claim 1, wherein the removing of the chemical enhancer layer comprises performing the plasma process step and a purge step repeatedly.

* * * * *